United States Patent [19]

Kunz et al.

[11] Patent Number: 5,415,694
[45] Date of Patent: May 16, 1995

[54] VACUUM COATING APPARATUS WITH ROTARY-DRIVEN SUBSTRATE CARRIER

[75] Inventors: Anton Kunz, Triesenberg, Liechtenstein; Erich Bergmann, Mels, Switzerland

[73] Assignee: Balzers Aktiengesellschaft, Liechtenstein

[21] Appl. No.: 58,539

[22] Filed: May 5, 1993

[30] Foreign Application Priority Data

May 8, 1992 [CH] Switzerland ............... 1489/92

[51] Int. Cl.⁶ ............................... C23C 16/00
[52] U.S. Cl. ............................ 118/730; 384/100; 384/121
[58] Field of Search .......... 118/730; 384/121, 100

[56] References Cited

U.S. PATENT DOCUMENTS

| | | | |
|---|---|---|---|
| 3,005,666 | 10/1961 | Morser et al. | 308/122 |
| 3,895,689 | 7/1975 | Swearingen | 384/121 |
| 4,306,754 | 12/1981 | Kraus | 384/121 |
| 4,362,020 | 12/1982 | Meacher | 384/121 |
| 4,822,182 | 4/1989 | Matsushita et al. | 384/107 |
| 4,836,693 | 6/1989 | Stroze | 384/121 |
| 4,915,510 | 4/1990 | Arvidsson | 384/121 |
| 5,078,091 | 1/1992 | Stewart | 118/730 |
| 5,110,407 | 5/1992 | Ono | 118/730 |
| 5,198,272 | 3/1993 | Eisfeller | 118/730 |
| 5,201,956 | 4/1993 | Humphrey | 118/730 |
| 5,207,835 | 5/1993 | Moore | 118/730 |
| 5,211,759 | 5/1993 | Zimmerman | 118/730 |

FOREIGN PATENT DOCUMENTS 1177877 9/1964 Germany .
241090 11/1986 Germany .

*Primary Examiner*—Richard Bueker
*Attorney, Agent, or Firm*—Notaro & Michalos

[57] ABSTRACT

In a vacuum coating apparatus with a rotary-driven substrate carrier, the bearing of the substrate carrier is implemented as a quasi-hydrostatic rotary transmission feedthrough. For receiving the parts to be coated, a mounting is provided which is operationally connected to a drive shaft. The drive shaft has a bearing disk. In operation this bearing disk is hydrostatically supported wherein the bearing can take place on both sides of the bearing disk via at least one annular channel for each side. The drive shaft is carried radially in the wall of the apparatus and the annular channels are disposed in a spring-supported housing. The bearing disk, in turn, is provided with radial channels which are operationally connected with axial channels of the shaft portion of the drive shaft. In this way the bearing of rotary-driven substrate carriers in the vacuum coating apparatus is solved.

11 Claims, 3 Drawing Sheets

VACUUM COATING APPARATUS WITH ROTARY-DRIVEN SUBSTRATE CARRIER

FIELD AND BACKGROUND OF THE INVENTION

The present invention relates to a vacuum coating apparatus with rotary-driven substrate carrier.

In coating heavy parts or a large number of parts of average weight in vacuum apparatus, a rotary table or a revolving plate for example, are set up in a rotary transmission feedthrough in the cover or in the floor of the apparatus. For many processes only the second solution is possible. It is therein necessary to decouple high loads from the central rotary feedthrough. A bearing of the substrate carrier by means of a friction bearing is not possible due to the limitation of material selection in time vacuum. The problem of the bearing therefore exists in rotary-driven substrate carriers of vacuum coating apparatus. The present invention intends to solve this problem.

SUMMARY OF THE INVENTION

The present invention relates in general to vacuum coating apparatuses, and in particular to a new and useful vacuum coating apparatus containing a rotary-driven substrate carrier with a hydrostatic rotary transmission feedthrough serving as the bearing for the carrier.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
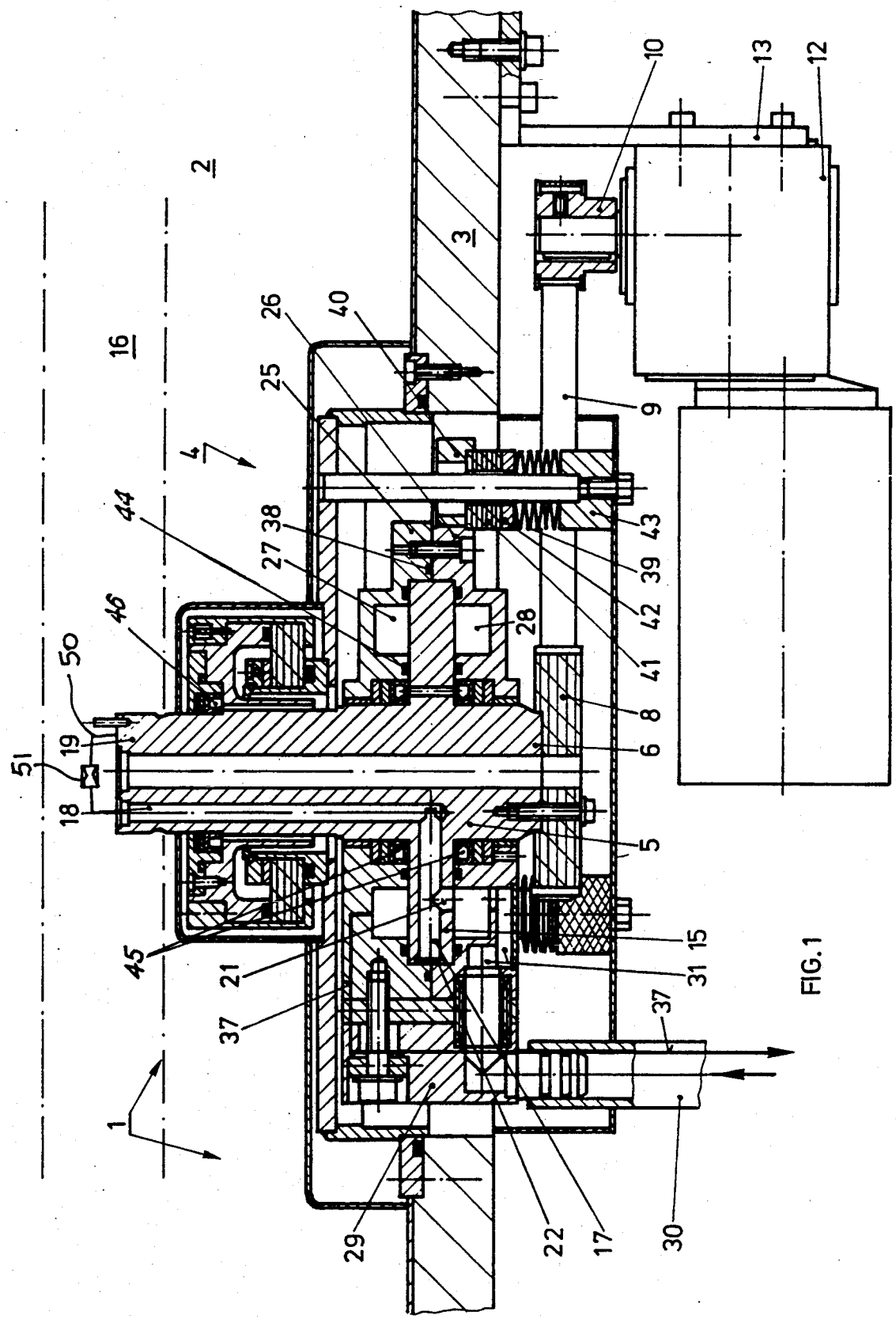
FIG. 1 is a longitudinal sectional view through a portion of a plasma coating apparatus with rotary-driven substrate carrier, taken along line 1—1 of FIG. 3.

The floor region of a vacuum coating apparatus 1, depicted in part in FIG. 1, has a bottom flange 3 with a superjacent vacuum chamber 2. The shown part of the apparatus 1, includes a rotary transmission feedthrough 4, that is, a passage opening for a shaft, in the chamber wall. Feedthrough 4 contains a drive and carrier shaft 5 at whose lower shaft neck 6 is fastened a toothed wheel or pulley 8, by means of screws. A toothed belt 9 connects the toothed wheel 8, in terms of drive, with a toothed wheel or pulley 10, which is seated on the shaft of a gear-box plus motor combination 12. The gear motor 12, in turn, is supported so as to be free of stress by means of a bearing block 13, on the bottom flange 3 of the apparatus.

The drive and carrier shaft 5 is provided, near its lower end, with a bearing disc 15, while at its upper end, a shaft collar 19 of the shaft, carries a revolving plate 16 indicated by a dot-dash line, which is fastened to the collar. The shaft 5 is rotatably sealed with respect to the vacuum chamber 2 through a rotary shaft seal 46. Support of the shaft takes place on the atmosphere side so that penetration of impurities, such as particles, into the vacuum chamber 2, can be prevented to an extremely high degree. This fact is very important since vacuum processes are extremely sensitive to particle impurities. The revolving plate 16 is the carrier of the parts to be coated in the vacuum chamber.

Figure 2:
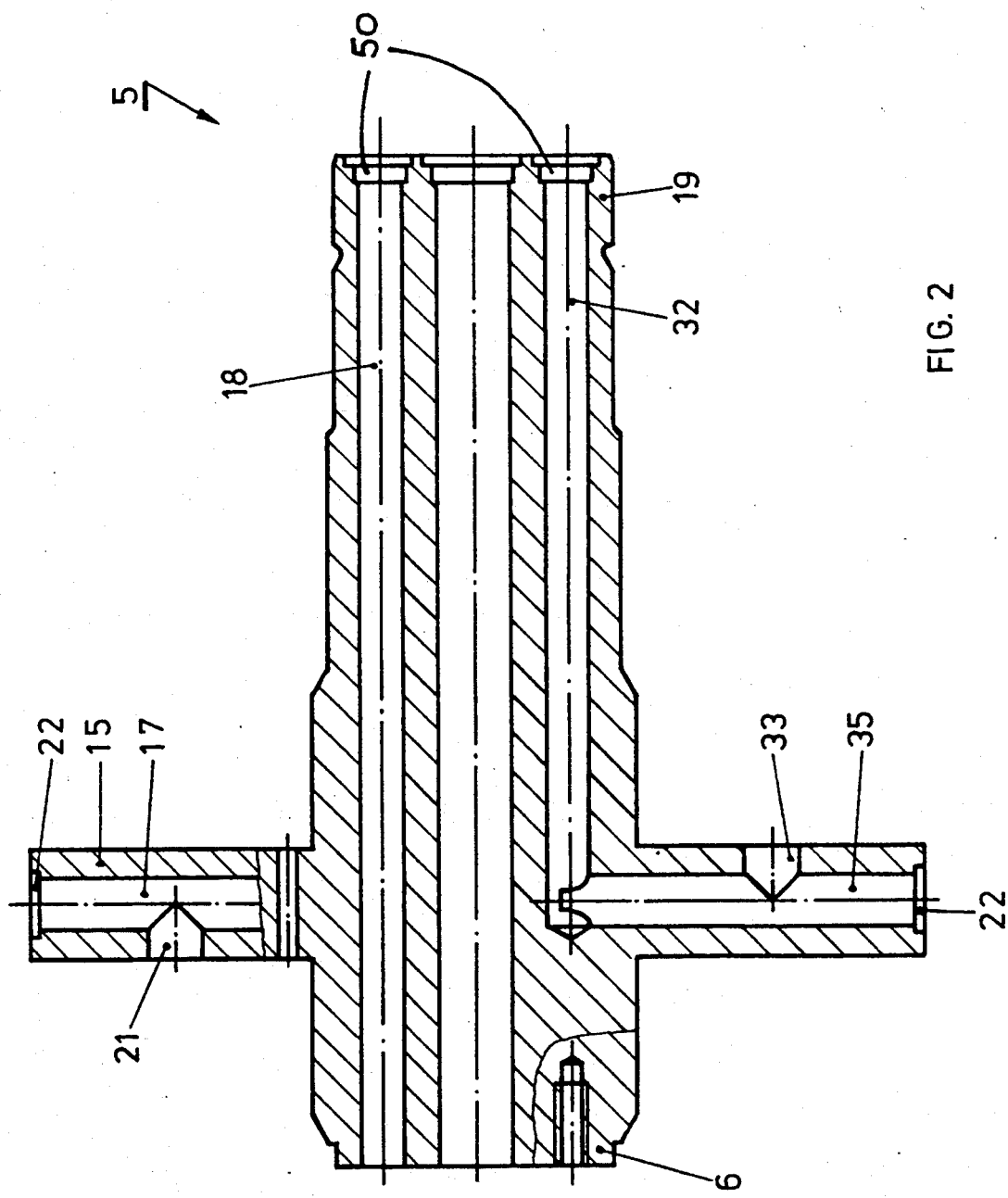
FIG. 2 is a longitudinal sectional view through the drive and carrier shaft of the apparatus, taken along line 2—2 of FIG. 3.

Bearing disk 15 of the drive and carrier shaft 5 serves as a stationary hydrostatic bearing. For this purpose, shaft 5 includes radial inflow bores 17 as is evident in the details of FIGS. 2 and 3. These radial bores 17 lead into axial inflow bores 18 which terminate at the upper shaft collar 19 and are connected via 180° deflection arcs 50, to corresponding axial outflow bores 32. The deflection arcs are preferably defined in the carrier plate 16 as shown in FIG. 1, but for illustration in FIG. 2 are shown at the end of collar 19.

Further inflow bores 21 in disc 15, lead to the radial bores 17. Bores 17 are closed off at their outer ends by means of closure plugs 22 (see FIG. 1).

The drive and carrier shaft 5 is supported with its bearing disk 15 in a bearing part having an upper bearing flange 25 and a lower bearing flange 26. The upper bearing flange 25 contains an upper annular channel 27 while a corresponding lower annular channel 28, opposing the upper annular channel 27 axially, is provided in the lower bearing flange 26. The bearing flanges 25, 26 are, for example screwed, together and sealed by O-ring seal 38. Rotary shaft seals 45 seal the housing comprising the bearing flanges 25, 26, around shaft 5 and above and below disc 15.

A compressed water pipe or union 30 terminates in a connection piece 29, connected to flange 25. Union 30 receives water from a pump (not shown) and leads via recesses 31, to inflow bores 21. Return bores 33 corresponding to inflow bores 21, terminate at radial drain bores 35 in a return flow path or line 37 comprising bores and recesses depicted only schematically in FIG. 1, which leads to a suction connection piece of the water pump (not shown). Path 37 thus schematically illustrates hydrostatic suction means of the invention. Media other than water can also be used.

In this design the question of sealing assumes great significance. Depending on the applied pressure conditions and weight loads, the bearing disk 15 rests more or less on upper or lower sliding rings 44 provided in pairs on opposite sides of disc 15 and at outer and inner circumferences of channels 27, 28. The sliding rings 44 simultaneously have a sealing function and consequently practically form seals. The sliding rings 44 can comprise, for example, bearing metals or synthetic materials, such as TEFLON (a trademark) material.

A support ring 40 carrying the bearing flanges 25 and 26 is, in turn, supported on three disk springs 39 which make it possible to set the supporting forces. A soft elastic bearing can, if necessary, also be used. Between the support ring 40 and an elastic washer 42 is disposed an electrical insulating disk 41. The disk springs 39 rest, in turn, on bearing nuts 43 with the aid of which the degree of softness or hardness of the springing of disk springs 39 can be set. A shaft connects each nut through intermediate parts, to the bottom flange 3 as the fixed frame of reference.

In operation the rotary transmission feedthrough 4 functions as follows:

The water pump or pump of some other bearing fluid (not shown) is started so that the water or other fluid flows at a rate set by a choke, in the circulatory system of the feedthrough, and at very low speed, as is usual with hydrostatic bearings. From the pump, the water arrives via the compressed water union 30 and the recesses 31, into the lower annular channel 28. Here the water pressure acts upon the upper annular surface of the lower annular channel 28 so that a lifting force directed in the upward direction supports the drive and carrier shaft 5 on the bearing disk 15. The water moves from the annular channel 28 through the inflow bores 21 into the radial inflow bores 17 and from there into the axial inflow bores 18. Subsequently it arrives at the deflection arcs 50 in the revolving plate 16 in which choke sites 51, that are variable in cross section are provided.

The water arrives subsequently through corresponding axial drain bores 32 and radial drain bores 35, and from there via return bores 33 in the upper annular channel 27 where it generates, with an appropriate water pressure acting upon the bearing disk 15, a force opposite to the stated lifting force. Its magnitude is a function of the size of the effective area on the bearing disk 15 and of the pressure obtaining there. Through a corresponding choke action in the deflection arcs of the revolving plate 16 the lifting force and its opposing force can be regulated so that, according to the weights of the objects to be coated on carrier plate 16, essentially an equilibrium position can be achieved in which the bearing disk 15 is supported hydrostatically. The hydrostatic medium, for example water, can simultaneously also be guided to the revolving plate 16 or the substrate carrier and can there be used as heating or especially as cooling means.

Figure 3:
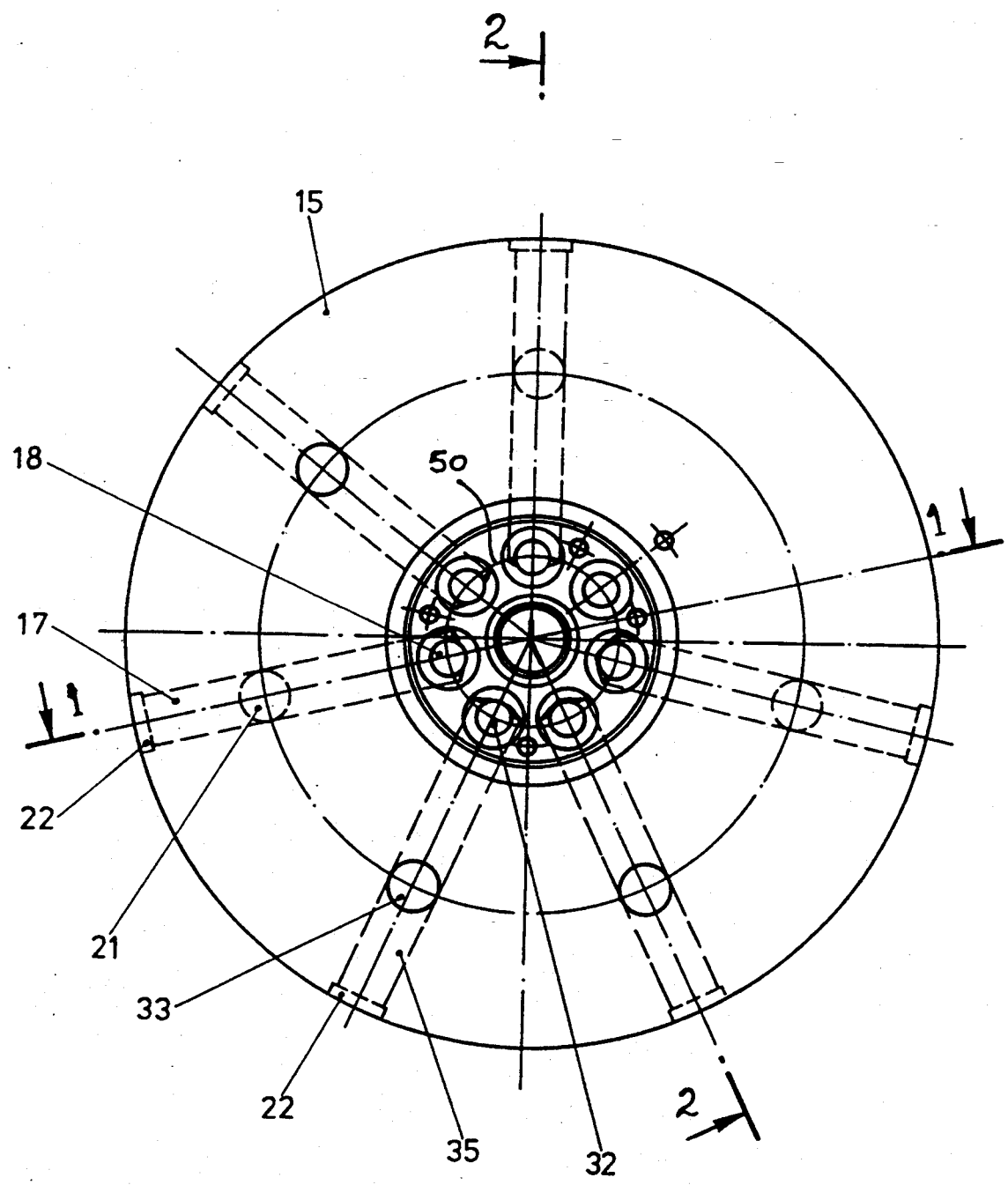
FIG. 3 is a top view of the drive and carrier shaft according to FIG. 2.

As is evident in FIG. 3, in the present example three axial inflow and corresponding drain bores each disposed in parallel are provided.

The entire bearing system with the rotating parts is supported on the disk springs 39 so that even in the presence of potentially sudden force changes no impacts occur on the drive system but rather a soft spring mechanism acts as a protection against impacts.

The bearing according to the invention can be installed in a vacuum apparatus in any position. For example, substrate holders such as rotary tables, calotte shells, baskets and the like can also be operated when suspended on the bearing.

The present bearing can take up large weights while simultaneously developing a small amount of friction or particles which is especially important for vacuum process apparatus. The implementation according to the invention can moreover be disposed readily outside of the process vacuum which increases additionally the safety of the protection against particles. But in simpler applications the bearing can also be operated directly in the vacuum without additional sealing 46.

The bearing of the invention permits, at high forces of several tens of kg and several hundreds of kg or greater loads, an extremely compact construction. This makes possible an advantageous design implementation of apparatus concepts. In the case of such a type of expensive and complex production apparatus this is an important economic factor. Although large leverage can occur the bearing according to the invention is essentially tilt-free. Very good damping properties are also present with respect to impacts and quiet running. This is extremely important in the case of vacuum processes due to the high precision required and the sensitive aggregates. Since, as stated, almost no friction is generated at the bearing parts a long operating life of the bearing and also the sealings is achievable.

Although the radial inflow bores 17 and radial drain bores 33, 35 are shown closed at their outer ends 22, this being on the outer circumference of the disc 15, it is possible to have the radial bores open and communicate with the hydrostatic path at the circumference of the disk to provide a radial hydrostatic bearing cushion in addition to the axial hydrostatic support of the shaft 5.

While a specific embodiment of the invention has been shown and described in detail to illustrate the application of the principles of the invention, it will be understood that the invention may be embodied otherwise without departing from such principles.

What is claimed is:

1. In a vacuum coating apparatus with a vacuum chamber having a rotary-driven substrate carrier, the improvement comprising:
    means defining a rotary feedthrough through a wall of the vacuum chamber;
    a rotary member for rotation in the rotary feedthrough and for carrying the substrate carrier; and
    a hydrostatic bearing supporting the rotary member in the rotary feedthrough for supporting rotation of the rotary member and for supporting the substrate carrier.

2. The improvement of claim 1, wherein the rotary member comprises a drive shaft connected to the substrate carrier and rotatable in the feedthrough, and means defining a hydrostatic path through the feedthrough for supporting rotation of and influencing a position for the drive shaft in the feedthrough.

3. The improvement of claim 2, including a bearing disk connected to and extending radially from the drive shaft, the bearing disk being in the hydrostatic path for receiving pressure on opposite sides of the disk for influencing a position of the shaft in the feedthrough.

4. The improvement of claim 3, wherein the means for defining the hydrostatic path include at least one annular channel on each side of the disk for receiving hydrostatic fluid and exerting pressures on opposite sides of the disk.

5. The improvement of claim 4, wherein the vacuum coating installation includes a flange defining the wall of a vacuum chamber, the drive shaft being carried for rotation through the flange.

6. The improvement of claim 5, wherein said means defining the hydrostatic path includes a housing containing each annular channel, and a spring support for supporting the housing with respect to the flange.

7. The improvement of claim 3, including at least one radial inflow bore extending in the disk for receiving hydrostatic fluid from the hydrostatic path, at least one radial drain bore in the disk for discharging fluid to the hydrostatic path and an axial bore in the shaft communicating with each of the radial bores, and with each other, for transferring fluid from the inflow bore to the drain bore.

8. The improvement of claim 7, wherein the radial inflow bore communicates with one of the channels on one side of the disk and the radial drain bore communicates with the other channel on the opposite side of the disk.

9. The improvement of claim 7, wherein the radial inflow and drain bores are outwardly open to a circumference of the disk for producing a hydrostatic radial bearing cushion around the disk.

10. The improvement if claim 3, including hydrostatic pump and suction means for exerting a selected hydrostatic pressure on the hydrostatic path to adjust for different loads on the shaft.

11. The improvement of claim 3, including choke means along the hydrostatic path for adjusting pressure on the drive shaft to compensate for different loads on the shaft.

* * * * *